United States Patent [19]

Hwang

[11] Patent Number: 5,767,756

[45] Date of Patent: Jun. 16, 1998

[54] ACTIVE QUADRATURE POWER SPLITTER

[75] Inventor: In-Duk Hwang, Daejeon, Rep. of Korea

[73] Assignee: Electronics and Telecommunications Research Institute, Daejeon, Rep. of Korea

[21] Appl. No.: 747,679

[22] Filed: Nov. 12, 1996

[30] Foreign Application Priority Data

Dec. 20, 1995 [KR] Rep. of Korea .................. 95-52638

[51] Int. Cl.$^6$ .................................................. H03H 11/36

[52] U.S. Cl. ...................... 333/124; 327/255; 330/148; 330/277; 330/286; 330/306; 333/128

[58] Field of Search .................. 333/109, 112, 333/117, 118, 124, 125, 128; 327/254, 255; 330/148, 277, 286, 306

[56] References Cited

U.S. PATENT DOCUMENTS 4,511,813  4/1985  Pan ............................ 333/109 X
4,987,384  1/1991  Yamanouchi et al. ............ 330/277 X
5,361,038  11/1994 Allen et al. .................. 333/124 X

*Primary Examiner*—Paul Gensler
*Attorney, Agent, or Firm*—Antonelli, Terry, Stout & Kraus, LLP

[57] ABSTRACT

An active quadrature power splitter having low power consumption is small in size and is inexpensive, for obtaining two output signals of which the phase difference is 90 degrees. Since the active quadrature power splitter operates as a microwave amplifier for obtaining two amplified microwave outputs having an equal magnitude and a phase difference of 90 degrees by using a matching circuit of the amplifier, a power gain can be obtained. Also, since a single FET or HBT is used and two output signals are generated in an output impedance matching circuit, the circuit becomes simplified. Therefore, the circuit can be easily implemented in a monolithic microwave IC and the chip size can be reduced.

42 Claims, 4 Drawing Sheets

ACTIVE QUADRATURE POWER SPLITTER

BACKGROUND OF THE INVENTION

The present invention relates to a power splitter used in a cordless communication apparatus, and more particularly to an active quadrature power splitter having low power consumption which is small in size and is inexpensive, for obtaining two output signals having a phase difference of 90 degrees.

In general, a power splitter which is generally called a coupler, hybrid or balun, distributes and supplies microwave power to a frequency mixer.

In order to generate a single sideband frequency from two frequencies in a cordless transceiver, a single sideband mixer is used. In order to eliminate an image frequency, an image rejection mixer is used.

A quadrature power splitter for distributing microwave power to two microwave output ports is necessary for constructing such a frequency mixer.

In the conventional technology for constructing the above-described quadrature power splitter, a method is known for adopting a passive power splitter (or hybrid) using microstrip lines.

However, the passive power splitter (or hybrid) using microstrip lines causes a power loss.

Also, the passive power splitter becomes bulky due to wavelength of the operational frequency, which make it difficult to be manufactured as monolithic microwave integrated circuit. This is quite a serious problem in current mobile communication systems wherein mobile terminals are decreasing gradually in size.

Thus, there has been proposed a method for adopting a lumped element for implementing the passive power splitter as the monolithic microwave IC. However, this method still involves the problem of significant power loss.

Accordingly, in order to overcome the drawbacks of the passive power splitter, there has been recently proposed an active power splitter using a field effect transistor (FET) as an active element.

As to the technology of the active power splitter, an active FET balun using a resonance or reactive technique is disclosed in detail in U.S. Pat. No. 5,039,891 (Aug. 13, 1991), in which two outputs having a phase difference of 180 degrees are obtained from a drain and a source of an FET, respectively.

The technology of active power splitters also includes U.S. Pat. No. 4,885,550 which discloses in detail an active FET balun adopting a differential amplifier for supplying an inverting output and a non-inverting output using two FETs, in which two outputs having a phase difference of 180 degrees are obtained from drains of the respective FETs.

However, since the phase difference between two outputs of said active power splitters is aimed to be 180 degrees, it is difficult to obtain two outputs having a phase difference of 90 degrees, which is required for constructing a single sideband mixer and an image rejection mixer.

SUMMARY OF THE INVENTION

To solve the above-mentioned problems, it is an object of the present invention to provide an active quadrature power splitter which can be easily implemented in a monolithic microwave integrated circuit (IC), has small chip area and obtains two amplified microwave outputs having an equal amplitude and a 90 degrees phase difference.

To accomplish the above object, there is provided an active quadrature power splitter comprising: a first output port for outputting a first signal; a second output port for outputting a second signal; an FET element having a gate, a drain and a source; an input impedance matching circuit for matching an input port to the gate of the FET element; a reactive voltage divider having two reactive elements connected in series with each other, one end being connected to the drain of the FET element, the other end being a.c. grounded, wherein the node thereof is the second output port; and an output impedance matching circuit having one end thereof connected to the drain of the FET element and the other end being connected to the first output port, for matching the output impedance of the FET element together with the reactive voltage divider, wherein a phase difference between output signals of the first and second output ports is 90 degrees.

Preferably, a common gate structure or a common source structure is adopted as a biasing method, and a self-bias circuit is used at a source for adjusting a gate to source voltage of the FET element. Instead of the FET element, one of a metal oxide semiconductor field effect transistor (MOSFET) element, a high electron mobility transistor (HEMT) element or a heterojunction bipolar transistor (HBT) element, can be used. Also, the first and second reactive elements constructing the reactive voltage divider can be distributive elements.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
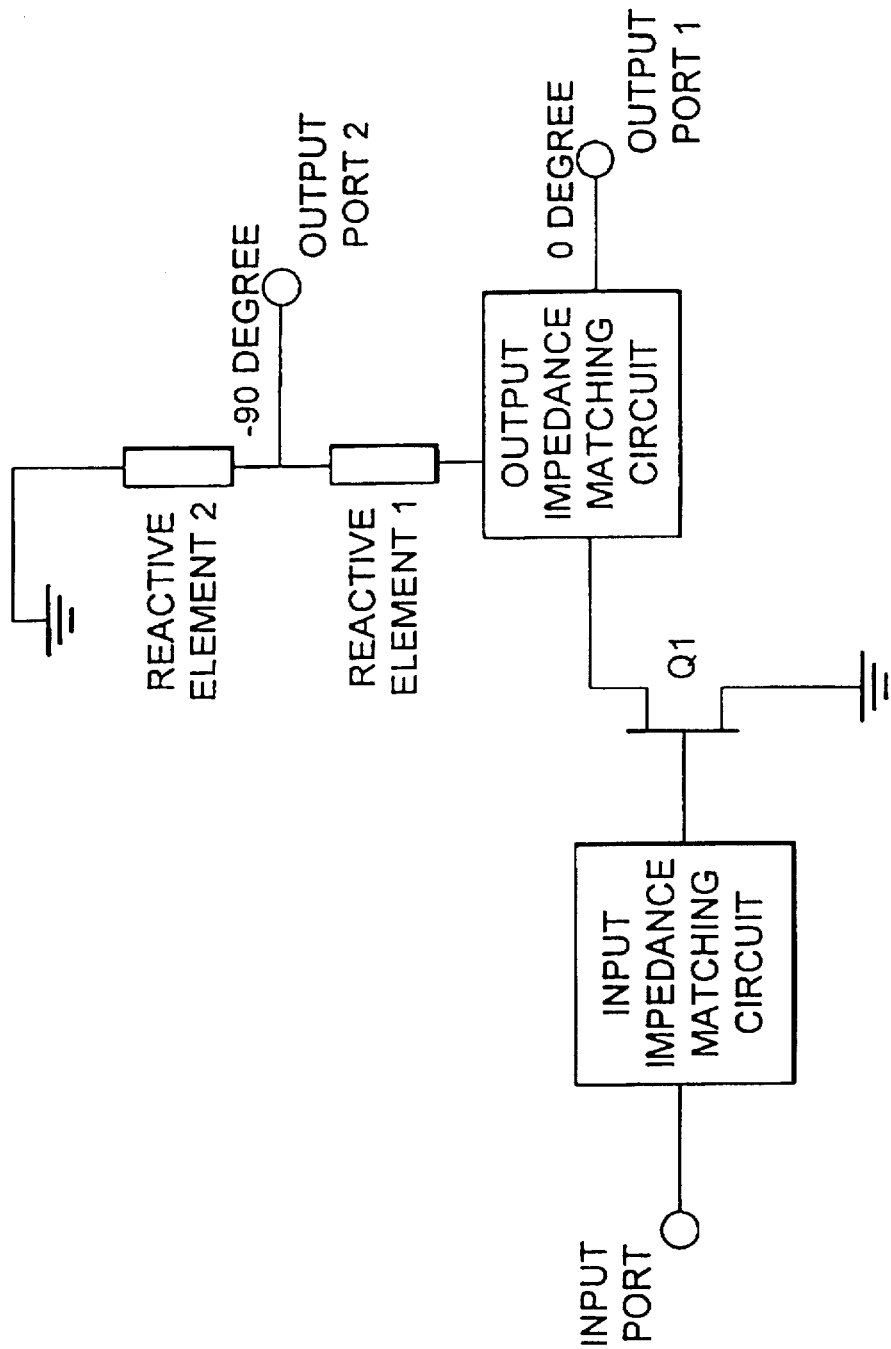
FIG. 1 is a schematic diagram of an active quadrature power splitter according to the present invention.

Referring to FIG. 1, the active quadrature power splitter according to the present invention includes an input port, an input impedance matching circuit for receiving an input signal through the input port and outputting the same, a FET element Q1, an output impedance matching circuit for receiving a signal from a drain port of the FET element Q1 and outputting the same, a reactive voltage divider having two reactive elements, and two output ports.

The above-constructed active quadrature power splitter according to the present invention basically has the same structure as that of a microwave amplifier, except that it has two output ports and a phase difference between two output signals thereof is 90 degrees.

Also, the FET element Q1 represents a three-port active element having a gate, a drain and a source, and the input signal is amplified by the FET element Q1 and is output to two output ports.

Also, the reactive voltage divider performs an output impedance matching function as well as a voltage dividing function.

Therefore, the output impedance matching function of the FET element is practically performed by the reactive voltage divider as well as by the output impedance matching circuit shown in FIG. 1.

The detailed example embodiment of the active quadrature power splitter according to the present invention having the aforementioned structure will now be described with reference to FIG. 2.

The FET element Q1 of the common source structure has a gate length of 1 micron and a width of 200 microns. Here, R2 represents a self bias resistor, and C4 represents a by-pass capacitor for a.c. grounding the source of the FET element.

The input impedance matching circuit is an L-section type comprised of a capacitor C1 and an inductor L1. The resistor R1 coupled to the inductor L1 is used for securing stability of the power splitter. The power splitter is unconditionally stable.

Here, the inductors L2 and L3 serially connected to each other act as the reactive voltage divider comprising reactive element 1 and reactive element 2 in FIG. 1, and the output port 2 is connected to the node thereof.

The capacitors C2 and C3 serially connected to each other act as the output impedance matching circuit in FIG. 1, and the output port 1 is connected to the node thereof.

The direct current (DC) is supplied from a power-supply (Vdd) to the FET element Q1 via the inductors L2 and L3.

The capacitor C5 is a by-pass capacitor and the inductor L3 is a.c. ground.

In this embodiment, in order to reduce the chip area, a bonding wire may be used as the inductor L3.

Figure 2:
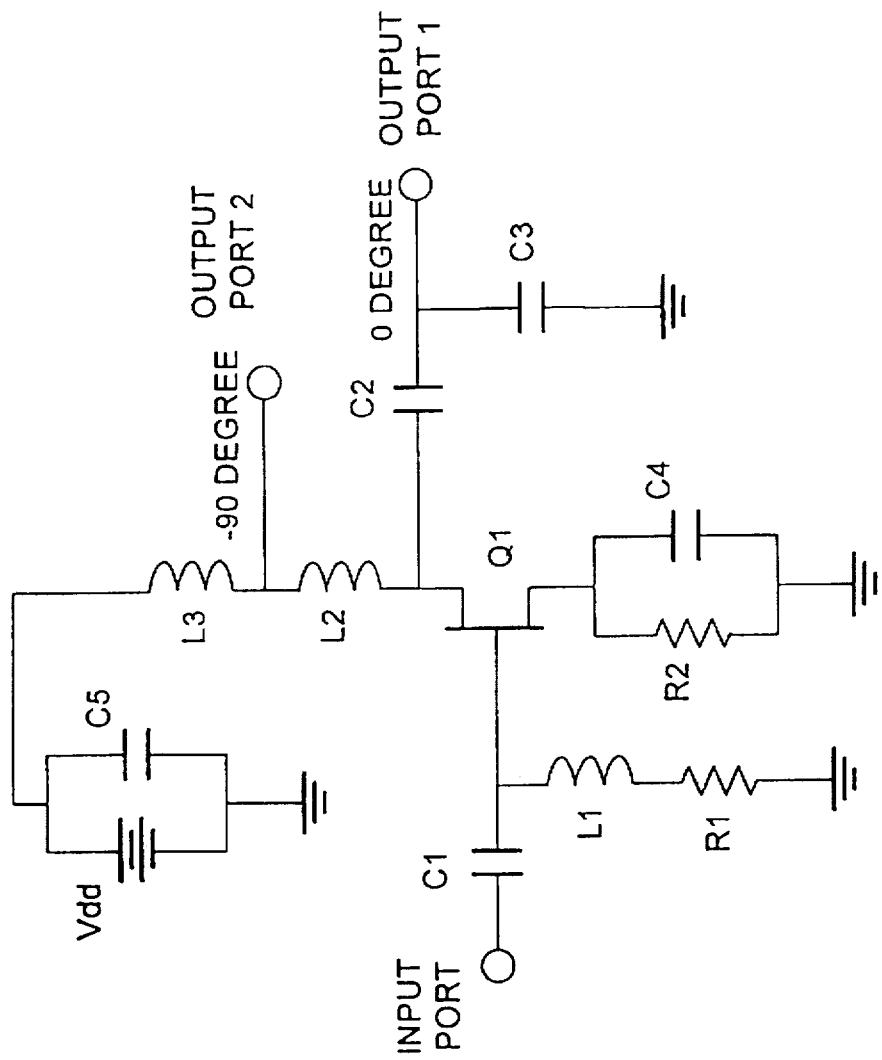
FIG. 2 a detailed example circuit diagram of the power splitter shown in FIG. 1.

Referring to FIG. 2, the active quadrature power splitter according to the present invention includes an input port, an input impedance matching circuit for receiving an input signal through the input port and outputting the same, an FET element Q1, an output impedance matching circuit having two capacitors, a reactive voltage divider having two inductors, and two output ports.

The power source for supplying direct current to the active element in FIG. 1 is omitted for the sake of convenience.

The structure of the active quadrature power splitter shown in FIG. 1 is a common source structure in which an input signal is applied to the gate of the FET element. However, it is also possible to implement the active quadrature power splitter according to the present invention in a common gate structure. This is because the microwave amplifier can be implemented in the common gate structure using conventional technology and the phase of the output signal of the active quadrature power splitter according to the present invention is determined by the output impedance matching circuit. The active quadrature power splitter having the common gate structure has the advantage that implementation of the input impedance matching circuit can be simple.

The characteristics of the output signals of the active quadrature power splitter implemented by the present invention having such a structure as shown in FIG. 2 will now be described in detail with reference to FIGS. 3 and 4.

Figure 3:
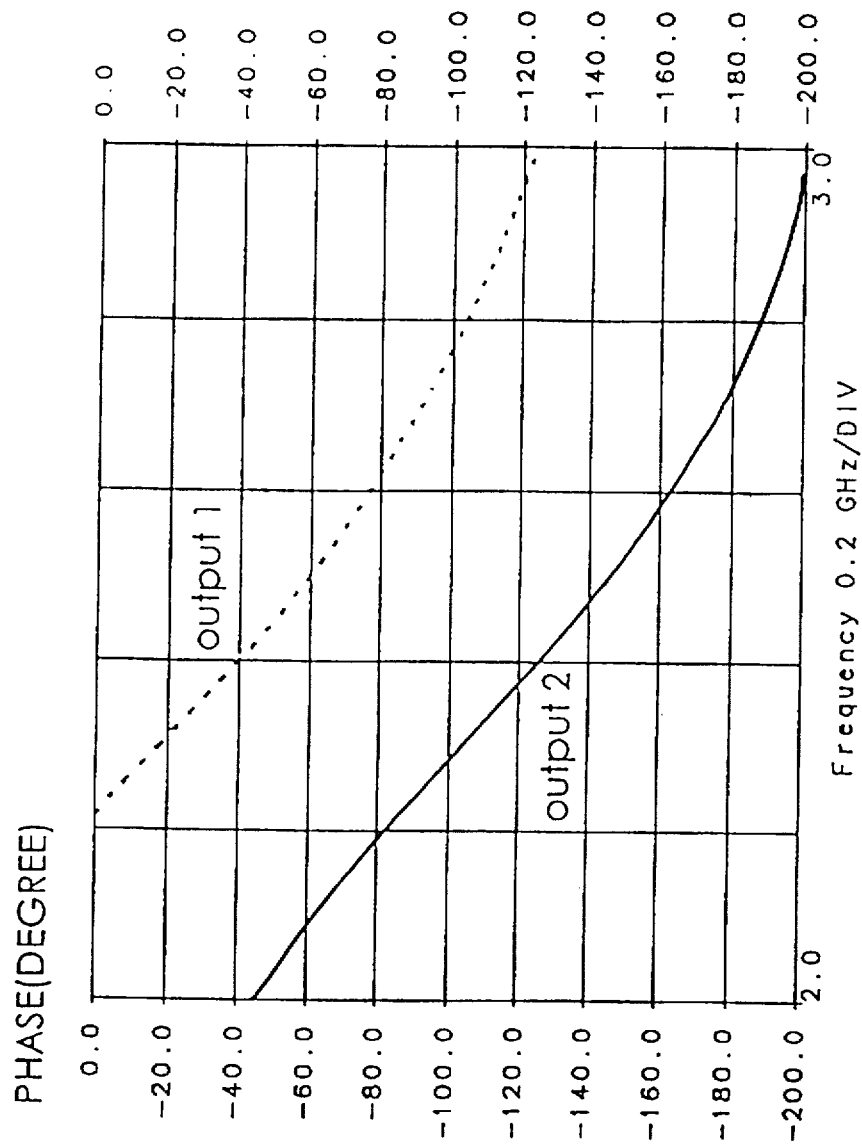
FIG. 3 is a graph showing a relationship between a frequency and a phase of output signals of the active quadrature power splitter shown in FIG. 2.

FIG. 3 is a graph showing a relationship between a frequency ranging from 2 GHz to 3 GHz and a phase of two output signals from the active quadrature power splitter, in which the first output signal is indicated by a dotted line and the second output signal is indicated by a solid line. FIG. 3 shows that the phase difference between the first output signal and the second output signal is 90 degrees with the deviation of less than 4 degrees.

Figure 4:
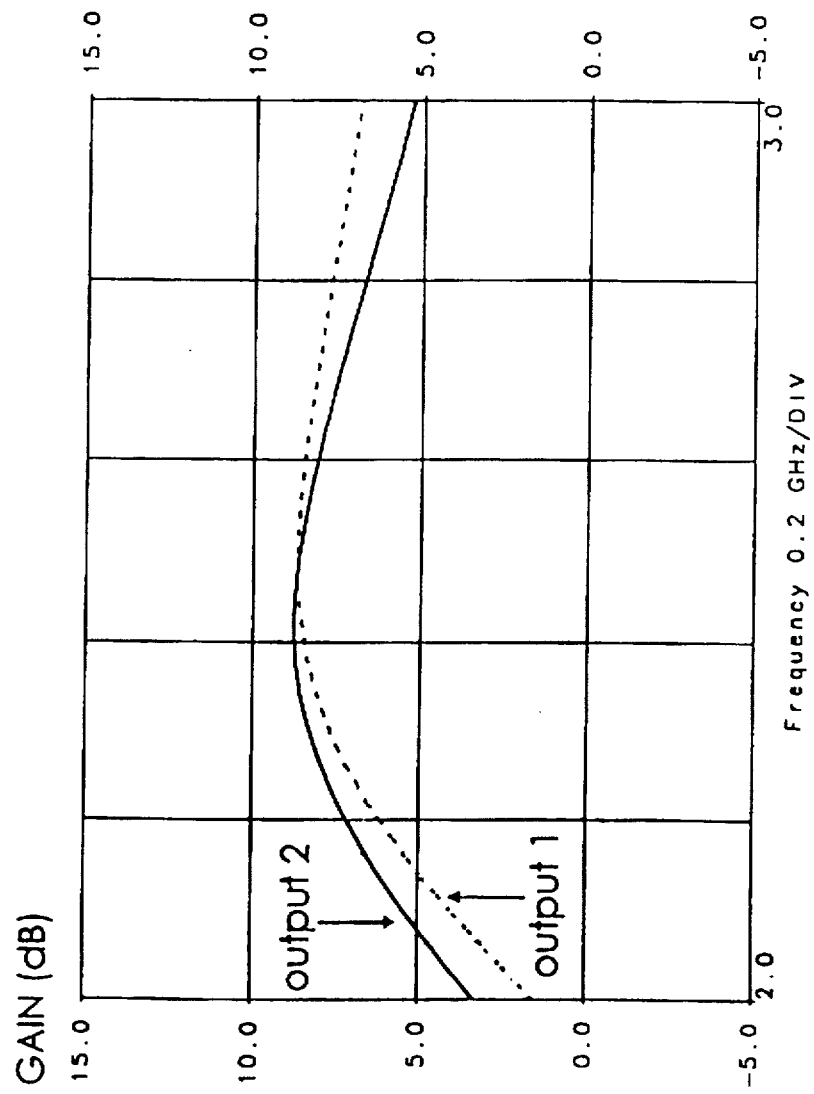
FIG. 4 is a graph showing a relationship between a frequency and a gain of output signals of the active quadrature power splitter shown in FIG. 2.

FIG. 4 is a graph showing a relationship between a frequency and a gain of two output signals of the active quadrature power splitter implemented by the present invention, in the dB unit, in which the first output signal is indicated by a dotted line and the second output signal is indicated by a solid line. FIG. 4 shows that the gain difference between the first output signal and the second output signal is less than 1.7 dB at a frequency ranging from 2.0 GHz to 3.0 GHz and less than 0.3 dB at the frequency ranging from 2.4 GHz to 2.5 GHz. It should be noted that the gain of the first output signal is the same as the gain of the second output signal.

The results of FIGS. 3 and 4 indicate that the present invention provides a very useful active quadrature power splitter which can obtain a gain.

Fine tuning using addtional elements may be necessary in manufacturing the active quadrature power splitter. However, the fine tuning can be easily performed using conventional technology.

However, while the circuit shown in FIG. 2 is a simplified active quadrature power splitter, the active quadrature power splitter according to the present invention may be further implemented in various circuit types.

In order to more simplify the implementation of the circuit shown in FIG. 2, the inductor L3 or capacitor C3 may be omitted.

Since the present invention is not related to wavelengths related to operational frequencies, it can be easily implemented in a monolithic microwave IC.

In FIG. 2, a narrow band matching circuit is used. However, by using more (two to six) reactive elements or resistive elements, a broad band active quadrature power splitter can be implemented.

Also, although a FET which is the most widely used active element is used as the active microwave element in the present invention, a MOSFET, HEMT or HBT element may be used.

Further, although two reactive elements of the reactive voltage divider shown in FIG. 1 are lumped elements, distributive elements may be used as the reactive elements, as well known in the microwave technology.

Therefore, the invention has been described in connection with particular embodiments with reference to accompanying drawings, it is to be understood that the invention is certainly not limited to these disclosed embodiments, but, on the contrary, is intended to cover various modifications and equivalent arrangements included within the spirit and scope of the appended claims.

What is claimed is:

1. An active quadrature power splitter, comprising:
    a first output port for outputting a first signal;
    a second output port for outputting a second signal;
    a field effect transistor (FET) element having a gate, a drain and a source;
    an input impedance matching circuit for matching an input port to said gate of said FET element;
    a reactive voltage divider having two reactive elements connected at a node in series with each other, one end thereof being connected to said drain of said FET element, the other end being a.c. grounded, and the node thereof being said second output port; and
    an output impedance matching circuit having one end thereof connected to said drain of said FET element and the other end connected to said first output port, said output impedance matching circuit matching the output impedance of said FET element together with said reactive voltage divider;

wherein a phase difference between output signals of said first and second output ports is 90 degrees.

2. An active quadrature power splitter as claimed in claim 1, wherein a common source structure is adopted as a biasing method, and a self-bias circuit is used at said source for adjusting the gate to source voltage of said FET element.

3. An active quadrature power splitter as claimed in claim 1, wherein a common gate structure is adopted as a biasing method.

4. An active quadrature power splitter as claimed in claim 1, wherein said FET element includes a metal oxide semiconductor field effect transistor (MOSFET) element.

5. An active quadrature power splitter as claimed in claim 1, wherein said FET element includes a high electron mobility transistor (HEMT) element.

6. An active quadrature power splitter as claimed in claim 1, wherein said first and second reactive elements of said reactive voltage divider are distributive elements.

7. A broad band active quadrature power splitter, comprising:

a first output port for outputting a first signal;

a second output port for outputting a second signal;

a field effect transistor (FET) element having a gate, a drain and a source;

a broad band input impedance matching circuit for matching an input port to said gate of said FET element;

a reactive voltage divider having two reactive elements connected at a node in series with each other, one end thereof being connected to said drain of said FET elements, the other end being a.c. grounded, and the node thereof being said second input port; and a broad band output impedance matching circuit having one end thereof connected to said drain of said FET element and the other end connected to said first output port, said broad band output impedance matching circuit matching the output impedance of said FET element together with said reactive voltage divider;

wherein a phase difference between output signals of said first and second output ports is 90 degrees.

8. A broad band active quadrature power splitter as claimed in claim 7, wherein a common source structure is adopted as a biasing method, and a self-bias circuit is used at said source for adjusting the gate to source voltage of said FET element.

9. A broad band active quadrature power splitter as claimed in claim 7, wherein a common gate structure is adopted as a biasing method.

10. A broad band active quadrature power splitter as claimed in claim 7, wherein said FET element includes a metal oxide semiconductor field effect transistor (MOSFET) element.

11. A broad band active quadrature power splitter as claimed in claim 7, wherein said FET element includes a high electron mobility transistor (HEMT) element.

12. A broad band active quadrature power splitter as claimed in claim 7, wherein said first and second reactive elements of said reactive voltage divider are distributive elements.

13. In an active quadrature power splitter, a monolithic microwave integrated circuit (IC) active quadrature power splitter comprises:

a first output port for outputting a first signal;

a second output port for outputting a second signal;

a field effect transistor (FET) element having a gate, a drain and a source;

an input impedance matching circuit for matching an input port to said gate of said FET element;

a reactive voltage divider having two reactive elements connected at a node in series with each other, one end thereof being connected to said drain of said FET element, the other end being a.c. grounded, and the node thereof being said second output port; and an output impedance matching circuit having one end thereof connected to said drain of said FET element and the other end connected to said first output port, said output impedance matching circuit matching the output impedance of said FET element together with said reactive voltage divider;

wherein a phase difference between output signals of said first and second output ports is 90 degrees.

14. A monolithic microwave IC active quadrature power splitter as claimed in claim 13 wherein the second reactive element of said reactive voltage divider is an a.c. grounded inductive element, and is being implemented by a bonding wire.

15. A monolithic microwave IC active quadrature power splitter as claimed in claim 13, wherein a common source structure is adopted as a biasing method, and a self-bias circuit is used at said source for adjusting the gate to source voltage of said FET element.

16. A monolithic microwave IC active quadrature power splitter as claimed in claim 13, wherein a common gate structure is adopted as a biasing method.

17. A monolithic microwave IC active quadrature power splitter as claimed in claim 13, wherein said FET element includes a metal oxide semiconductor field effect transistor (MOSFET) element.

18. A monolithic microwave IC active quadrature power splitter as claimed in claim 13, wherein said FET element includes a high electron mobility transistor (HEMT) element is used.

19. A monolithic microwave IC active quadrature power splitter as claimed in claim 13, wherein said first and second reactive elements of said reactive voltage divider are distributive elements.

20. An active quadrature power splitter, comprising:

a first output port for outputting a first signal;

a second output port for outputting a second signal;

a field effect transistor (FET) element having a gate, a drain and a source;

an input impedance matching circuit for matching an input port to said gate of said FET element;

a reactive voltage divider having two inductors connected at a node in series with each other, one end thereof being connected to said drain of said FET element, the other end being a.c. grounded, and the node thereof being said second output port; and an output impedance matching circuit having two capacitors connected in series with each other, one end thereof being connected to said drain of said FET element, the other end being a.c. grounded, and the node thereof being said first output port;

wherein a phase difference between output signals of said first and second output ports is 90 degrees.

21. An active quadrature power splitter as claimed in claim 20, wherein a common source structure is adopted as a biasing method, and a self-bias circuit is used at said source for adjusting the gate to source voltage of said FET element.

22. An active quadrature power splitter as claimed in claim 20, wherein a common gate structure is adopted as a biasing method.

23. An active quadrature power splitter as claimed in claim 20, wherein said FET element includes a metal oxide semiconductor field effect transistor (MOSFET) element.

24. An active quadrature power splitter as claimed in claim 20, wherein said FET element includes a high electron mobility transistor (HEMT) element.

25. An active quadrature power splitter as claimed in claim 20, wherein said two inductors of said reactive voltage divider are distributive elements.

26. An active quadrature power splitter, comprising:
a first output port for outputting a first signal;
a second output port for outputting a second signal;
a heterojunction bipolar transistor (HBT) element having a base, a collector and a emitter;
an input impedance matching circuit for matching an input port to said base of said HBT element;
a reactive voltage divider having two reactive elements connected at a node in series with each other, one end thereof being connected to said collector of said HBT element, the other end being a.c. grounded, and the node thereof being said second output port; and
an output impedance matching circuit having one end thereof connected to said collector of said HBT element and the other end connected to said first output port, for matching the output impedance of said HBT element together with said reactive voltage divider;
wherein a phase difference between output signals of said first and second output ports is 90 degrees.

27. An active quadrature power splitter as claimed in claim 26, wherein a common emitter structure is adopted as a biasing method, and a self-bias circuit is used at said emitter for adjusting the base to emitter voltage of said HBT element.

28. An active quadrature power splitter as claimed in claim 26, wherein a common base structure is adopted as a biasing method.

29. An active quadrature power splitter as claimed in claim 26, wherein said first and second reactive elements of said reactive voltage divider are distributive elements.

30. A broad band active quadrature power splitter, comprising:
a first output port for outputting a first signal;
a second output port for outputting a second signal;
a heterojunction bipolar transistor (HBT) element having a base, a collector and a emitter;
a broad band input impedance matching circuit for matching an input port to said base of said HBT element;
a reactive voltage divider having two reactive elements connected at a node in series with each other, one end thereof being connected to said collector of said HBT element, the other end being a.c. grounded, and the node thereof being said second output port; and
a broad band output impedance matching circuit having one end thereof connected to said collector of said HBT element and the other end connected to said first output port, said broad band output impedance matching circuit matching the output impedance of said HBT element together with said reactive voltage divider;
wherein a phase difference between output signals of said first and second output ports of 90 degrees.

31. A broad band active quadrature power splitter as claimed in claim 30, wherein a common emitter structure is adopted as a biasing method, and a self-bias circuit is used at said emitter for adjusting the base to emitter voltage of said HBT.

32. A broad band active quadrature power splitter as claimed in claim 30, wherein a common base structure is adopted as a biasing method.

33. A broad band active quadrature power splitter as claimed in claim 30, wherein said first and second reactive elements of said reactive voltage divider are distributive elements.

34. In an active quadrature power splitter, a monolithic microwave integrated circuit (IC) active quadrature power splitter comprises:
a first output port for outputting a first signal;
a second output port for outputting a second signal;
a heterojunction bipolar transistor (HBT) element having a base, a collector and a emitter;
an input impedance matching circuit for matching an input port to said base of said HBT element;
a reactive voltage divider having two reactive elements connected at a node in series with each other, one end thereof being connected to said collector of said HBT element, the other end being a.c. grounded, and the node thereof being said second output port; and
an output impedance matching circuit having one end thereof connected to said collector of said HBT element and the other end connected to said first output port, said output impedance matching circuit matching the output impedance of said HBT element together with said reactive voltage divider;
wherein a phase difference between output signals of said first and second output ports is 90 degrees.

35. A monolithic microwave IC active quadrature power splitter as claimed in claim 34, wherein said second reactive element of said reactive voltage divider is an a.c. grounded inductive element, and is implemented by a bonding wire.

36. A monolithic microwave IC active quadrature power splitter as claimed in claim 34, wherein a common emitter structure is adopted as a biasing method, and a self-bias circuit is used at said emitter for adjusting the base to emitter voltage of said HBT element.

37. A monolithic microwave IC active quadrature power splitter as claimed in claim 34, wherein a common base structure is adopted as a biasing method.

38. A monolithic microwave IC active quadrature power splitter as claimed in claim 34, wherein said first and second reactive elements of said reactive voltage divider are distributive elements.

39. An active quadrature power splitter, comprising:
a first output port for outputting a first signal;
a second output port for outputting a second signal;
a heterojunction bipolar transistor (HBT) element having a base, a collector and a emitter;
an input impedance matching circuit for matching an input port to said base of said HBT element;
a reactive voltage divider having two inductors connected at a node in series with each other, one end thereof being connected to said collector of said HBT element, the other end being a.c. grounded, and the node thereof being said second output port; and an output impedance matching circuit having two capacitors connected in series with each other, one end thereof being connected to said collector of said HBT element, the other end being a.c. grounded, and the node thereof being said first output port;

wherein a phase difference between output signals of said first and second output ports is 90 degrees.

40. An active quadrature power splitter as claimed in claim 39, wherein a common emitter structure is adopted as a biasing method, and a self-bias circuit is used as said emitter for adjusting the base to emitter voltage of said HBT element.

41. An active quadrature power splitter as claimed in claim 39, wherein a common base structure is adopted as a biasing method.

42. An active quadrature power splitter as claimed in claim 39, wherein said two inductors of said reactive voltage divider are distributive elements.

* * * * *